(12) United States Patent
Veselinovic et al.

(10) Patent No.: US 7,205,914 B1
(45) Date of Patent: Apr. 17, 2007

(54) SYSTEM AND METHOD FOR EFFICIENT UPSAMPLED SIGNAL PROCESSING

(75) Inventors: Dusan S. Veselinovic, Chicago, IL (US); Daniela Radakovic, Park Ridge, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/262,424

(22) Filed: Oct. 28, 2005

(51) Int. Cl.
*H03M 7/00* (2006.01)

(52) U.S. Cl. .......................... 341/61; 341/155
(58) Field of Classification Search ............... 341/61, 341/155, 143; 375/141
See application file for complete search history.

(56) References Cited

U.S. PATENT DOCUMENTS

| | | | |
|---|---|---|---|
| 5,748,126 A * | 5/1998 | Ma et al. ................... | 341/143 |
| 6,724,335 B1 * | 4/2004 | Gomez et al. ............. | 341/144 |
| 6,768,441 B2 * | 7/2004 | Singvall et al. ............. | 341/155 |
| 6,788,236 B2 * | 9/2004 | Erdogan et al. ............ | 341/155 |
| 6,988,116 B2 * | 1/2006 | Corless et al. .............. | 708/300 |

* cited by examiner

Primary Examiner—Rexford Barnie
Assistant Examiner—Joseph Lauture
(74) Attorney, Agent, or Firm—David S. Noskowicz

(57) ABSTRACT

A system and method for efficiently upsampling and filtering a signal is provided. The system includes a controller 216 and an upsampler 202 capable of upsampling a digitized signal. The upsampler 202 converts a digitized signal having a first sampled frequency into a digitized signal having a second sampled frequency by inserting, for example, at least one zero between the samples of the digitized signal. A plurality of filters 205–208 is coupled to the upsampler. These filters, which may be band-pass filters, would be suitable for front end encoding in audio-based applications. The controller 216 adjusts at least one output of the plurality of the filters to zero, either by deactivation or forcing the filter to zero, based upon a predetermined characteristic of the digitized signal. One example of a predetermined characteristic is a maximum frequency of interest.

17 Claims, 4 Drawing Sheets

SYSTEM AND METHOD FOR EFFICIENT UPSAMPLED SIGNAL PROCESSING

BACKGROUND

1. Technical Field

This invention relates generally to a system and method for efficient upsampling and filtering, and more specifically to a system and method for upsampling and filtering without the use of a low-pass filter.

2. Background Art

Digital audio systems rely upon analog to digital converters for their operation. Analog to digital converters allow a conventional analog waveform, like acoustic energy for example, to be sampled and quantized into a data stream of binary numbers. The conversion from an analog waveform to digital number sequence allows computers and microprocessors to accurately and reliably store, recall, transform and reproduce audio sound.

During this sampling process, the analog wave is effectively "chopped up" into discrete digital values. The sampling process, by its very nature, introduces quantization noise into the analog to digital system, as the formerly smooth analog wave essentially becomes a piece-wise linear approximation of that wave. In addition to the quantization noise, a phenomenon known as "aliasing" causes multiples of the analog wave to appear as duplicate images above the frequency of interest. These duplicates will compromise the quality of signal when the discrete digital values are converted back into an analog wave.

For example, an audio signal having frequency components ranging from 0 to 22 kHz must be sampled, in accordance with Nyquist's Theorem, at a frequency of at least 44 kHz. In addition to quantization noise, duplicate images will appear at multiples of the original analog frequencies. A first duplicate appears from 22 kHz to 44 kHz, a second duplicate appears at 44 kHz to 66 kHz, and so forth.

To eliminate quantization and oversampling noise, prior art systems employed very high-order, complex low-pass filters to eliminate frequency components above the desired frequency. Using the example in the preceding paragraph, a designer may employ a fourth or fifth order Chebychev filter to try and eliminate all frequency components above 22 kHz. The problem with these filters is not only are they expensive, but they often became unstable and introduce other forms of noise into the system.

To rectify these problems, designers have begun using a process known as oversampling. In oversampling, rather than sampling the analog signal at twice the maximum frequency of interest, the system may sample the analog signal at four, eight or even sixteen times the maximum frequency of interest. Continuing with the example from above, the 0–22 kHz signal may be sampled at 88 kHz, 176 kHz or 352 kHz. This oversampling causes the duplicate images to be pushed to higher and higher frequencies. For example, at 4× oversampling, the first image appears at 66–88 kHz, rather than 22–44 kHz. Additionally, as the oversampling rate increases, the quantization noise becomes spread across a larger spectrum, thereby increasing the signal to noise ratio. As a result, simpler, lower-order low-pass filters may be used to eliminate the duplicates.

Designers also realized that a similar process, upsampling, could be carried out in the digital domain to increase the overall quality of the signal. The process of upsampling is similar to oversampling, in that a digital data stream of one frequency is increased to a higher frequency. In upsampling, the process is carried out by inserting additional samples between the initial samples. These additional samples may be either zeroes or interpolated values between adjoining data points.

As with oversampling, in conventional upsampling systems an upsampled data stream is passed through a low-pass filter to remove any duplicate images introduced by the upsampling process. The filtered, upsampled data stream may then be passed on to other signal processing modules, circuits and components.

The problem with these prior art upsampling systems is that the low-pass digital filter requires both time and processing power when in operation. This time and processing power, especially in the realm of battery-powered, mobile electronics, can come at the expense of other functions. Additionally, the processing power required to implement these filters is "multiply and accumulate" processing power. In the world of microprocessors, performance is sometimes determined by how many multiply and accumulate (MAC) operations the processor can perform in one second. As there is a finite amount of MAC operations that a device may perform, for every one that must be dedicated to filtering, one less is available for other functions.

There is thus a need for an improved upsampling system with increased efficiency.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1:
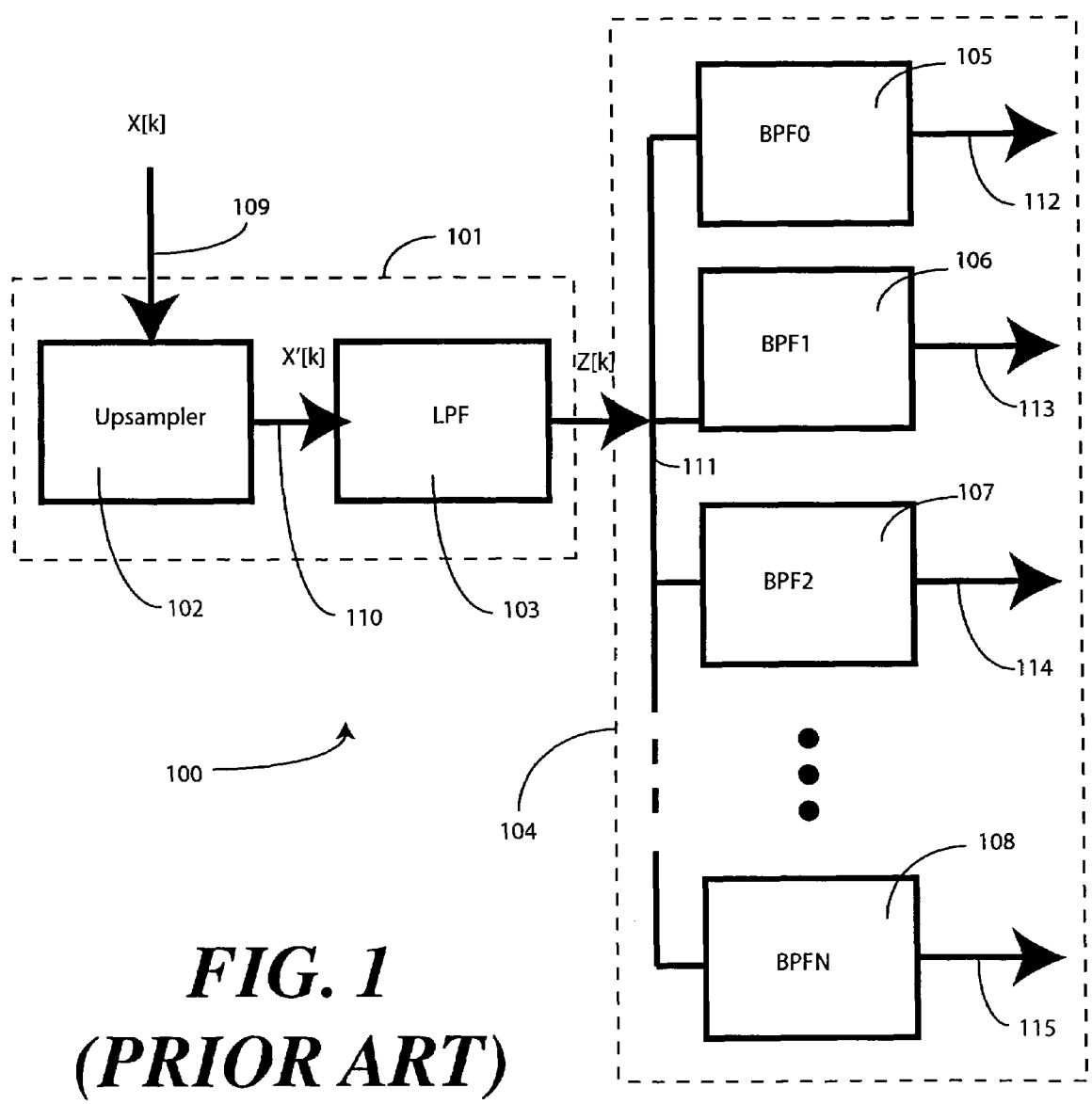
FIG. 1 illustrates a prior art upsampling system employing a low-pass filter.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

Before describing in detail embodiments that are in accordance with the present invention, it should be observed that the embodiments reside primarily in combinations of method steps and apparatus components related to efficient upsampling, which is useful in front end encoders. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

It will be appreciated that embodiments of the invention described herein may be comprised of one or more conventional processors and unique stored program instructions that control the one or more processors to implement, in conjunction with certain non-processor circuits, some, most, or all of the functions of efficient upsampling and filtering described herein. The non-processor circuits may include, but are not limited to, a radio receiver, a radio transmitter, signal drivers, clock circuits, power source circuits, and user input devices. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Further, relational terms such as first and second, top and bottom, and the like may be used solely to distinguish one entity or action from another entity or action without necessarily requiring or implying any actual such relationship or order between such entities or actions.

The present invention offers an efficient method and system for upsampling and filtering signals. Specifically, the method and system of this invention allow a signal to be upsampled and processed without a low-pass filter where a predetermined characteristic of the signal is known. One application well suited for the system and method of this invention is an encoder module in a portable electronic device like a radiotelephone, music player or video player.

In one embodiment of the invention a controller works in conjunction with an upsampler. The upsampler inserts data between existing samples of an incoming data stream. For instance, if the incoming sample stream is a sampled audio signal, the upsampler may upsample by inserting one or more zeroes between each sample of the sampled audio signal. In so doing, the upsampler increases the sample frequency of the overall data stream.

In many applications, predetermined characteristics are known about the incoming signals. For instance, in a telephone-based application, not all audible frequencies are transmitted from one telephone to the next. In conventional applications like a public switched telephone network for example, only frequencies ranging from 300 Hz to 3 kHz are transmitted. The controller of this invention takes advantage of this predetermined characteristic and adjusts certain post processing operations accordingly to eliminate the need of any low-pass filtering after the upsampling stage. The net result is increase overall efficiency, as both less memory and less multiply and accumulate commands are required in signal processing. This increased efficiency leads to longer battery life and more processing power that may be dedicated to other circuits and modules.

Turning briefly to FIG. 1, illustrated therein is a conventional upsampling system 100 that may be employed with an encoder. The system 100 includes an upsampling module 101 and an encoder 104. The upsampling module 101 includes an upsampler 102 and a low-pass filter 103. As noted above, when an incoming signal 109 having a sampled frequency of Fs is upsampled, a number of samples are introduced between each sample in the incoming signal 109. The result is an upsampled signal 110 having an upsampled frequency Fs'. By way of example, if the sample frequency is 4 kHz, and two zeroes are inserted between each sample, the upsampled frequency would be 12 kHz.

As also noted above, the upsampling causes duplicate images to appear at frequencies of above the frequency of interest. To eliminate these aliased images, the low-pass filter 103 is used to cut out duplicate images above the frequency of interest. Continuing the example from above, assuming a 4 kHz incoming signal and an upsampling by 3, the low-pass filter 109 would remove all duplicate images above 2 kHz. (After upsampling, the upsampled sample frequency is 12 kHz. Per Nyquist's Theorem, 6 kHz is the maximum available frequency. Dividing 6 kHz by M, where M=3, yields 2 kHz.)

In more general terms, for an incoming signal 109 with a sample frequency Fs, the frequency of interest, staying in accordance with Nyquist's Theorem, could be no more than 0 to Fs/2. Normalized, this may be represented as ranging from 0 to $\pi$. The period of the incoming signal may be expressed as $2\pi$. When the upsampler 102 upsamples by a factor of M, the frequency of interest gets "compressed" by a factor of M. It is thus periodic with a period of $2\pi/M$. The low-pass filter 103, to effectively eliminate the images, must remove all frequencies above $\pi/M$.

When used in an encoding application, the upsampled, low-pass filtered signal 111 may then be fed into a bank of band-pass filters 105–108 for processing, thereby yielding a series of upsampled, low-pass filtered, band-pass filtered signals 112–115. Systems like that shown in FIG. 1 are often employed in front-end modules of consumer electronics.

Figure 2:
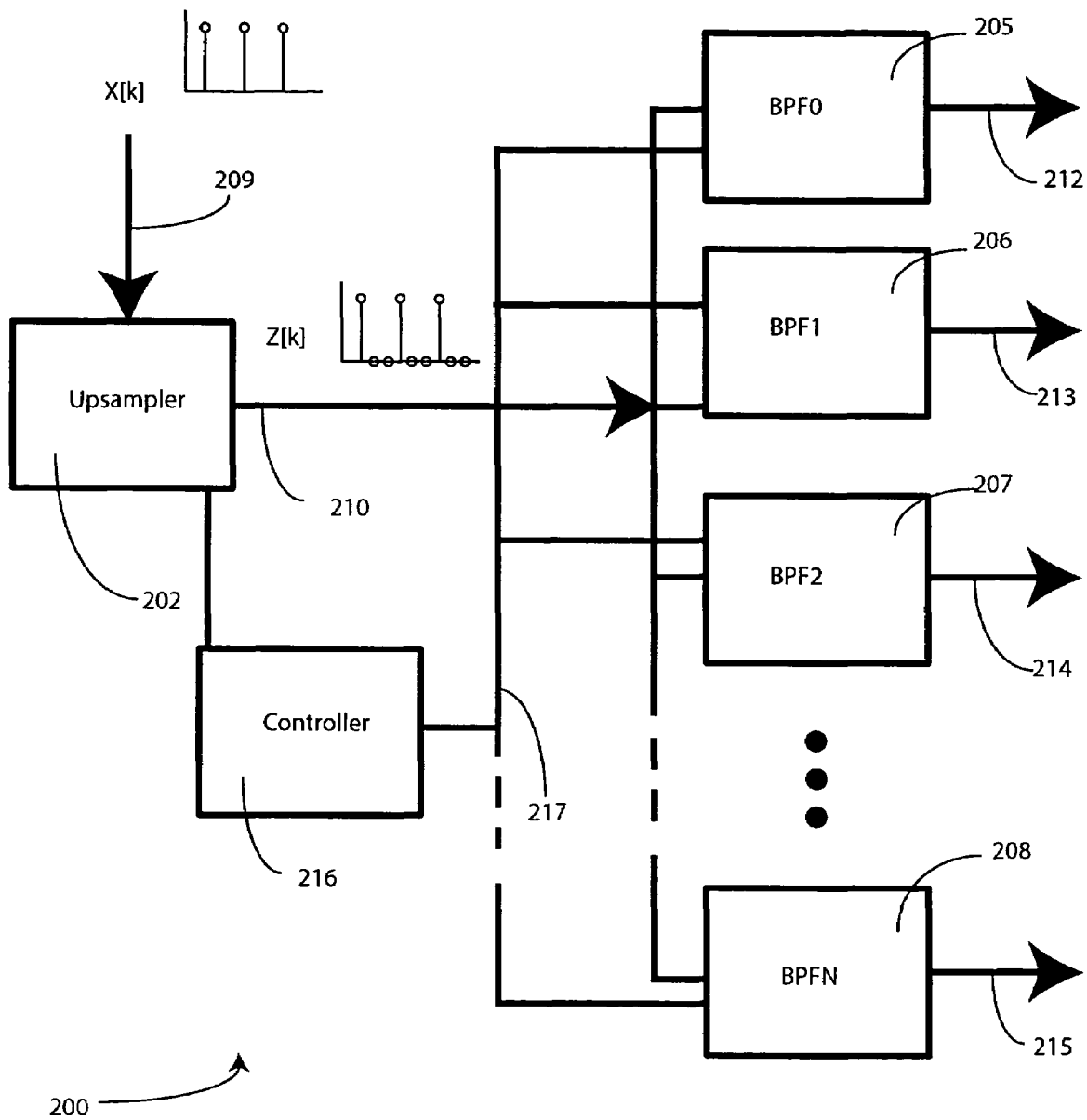
FIG. 2 illustrates an efficient upsampling system and method in accordance with the invention.

Turning now to FIG. 2, illustrated therein is a system for efficient upsampling 200 in accordance with the invention. The system 200, which may be used for processing a digitized signal and is suitable for encoder applications, includes a controller 216, and upsampler 202 and a plurality of filters 205–208 coupled to the upsampler 202. Each filter 205–208 has a corresponding output 212–215. The modules of the system 200 may be employed or effected in the front end module of a signal encoder. Alternatively, they may be disposed in a stand-alone module, or integrated into one component, like a microprocessor, application specific integrated circuit (ASIC) or digital signal processor.

The upsampler 202 is capable of upsampling an incoming signal 209 by a factor of M. In one embodiment, the upsampling factor M is an integer. As the incoming signal 209 is a digitized signal including a series of samples, the upsampler 202 upsamples by inserting at least one zero between each of the series of samples, thereby converting the digitized signal sampling frequency to an "upsampled" digitized signal sampling frequency. It will be clear to those of ordinary skill in the art having the benefit of this disclosure that values other than zeroes may be inserted between each of the series of samples. For example, the average values of the adjoining samples may be inserted rather than samples with a zero value.

For signals characterized by a predetermined characteristic, like a maximum frequency of interest for example, the controller 216 eliminates the need for a low-pass filter by adjusting at least one filter output, e.g. output 215 of filter 208 based upon the predetermined characteristic. As such, no low-pass filter is coupled between the plurality of filters 205–208 and the upsampler 202.

For instance, where the predetermined characteristic is a maximum frequency of interest, the controller 216 may adjust one of the filters, e.g. filter 208, by either deactivation, i.e. not running the filter, or by setting it's output 215 to zero. Note that in one embodiment, each of the plurality of filters 205–208 is a digital filter that may be implemented mathematically within a processing component. As such, the "deactivating" may be deliberately not running that filter within the processing component, or not applying the filter to the upsampled signal. Where output values of that filter are required by post processing circuits, the controller my supply a series of zeroes. It will be clear to those of ordinary skill in the art that the deactivating or setting to zero may be done in a variety of ways, but the net result is the same: the output, if and when required, is zero.

Taking the telephone example from above, where the predetermined characteristic of the incoming signal 209 is a maximum frequency of 3 kHz, the controller assumes that an upsampled, low-pass filtered signal would cause zeroes to be forthcoming from some of the plurality of filters 205–208, as frequencies above the maximum frequency of interest, scaled by the upsampling factor, would have been eliminated by the low-pass filter in a conventional system. The invention takes advantage of this knowledge and eliminates the need for any memory allocation or multiply and accumulate commands that would be required by a low-pass filter. The invention does so with the controller 216, which can set at least one filter, e.g. filter 208, to zero by not running the filter or forcing its output 215 to be zero.

Where the plurality of filters 205–208 has N filters, the number of filters that may be deactivated or set to zero depends upon the predetermined characteristic. In one embodiment, suitable for use in an encoder, each of the filters 205–208 is a band-pass filter having a pass bandwidth associated therewith. In such a scenario, the pass bandwidth associated with each filter, for the filters to evenly cover the spectrum, is the upsampled digitized sampling frequency divided by 2*N. The controller 216 is then be able to adjust the outputs of the filters having pass band frequencies greater than the upsampled digitized signal sampling frequency divided by M by deactivating those filters or setting their outputs to zero.

The operation of this system 200, set forth in general above, is perhaps more easily understood by way of an example. The following example is illustrative only and is presented to better explain the operation of the components in the system 200. Presume for the purposes of this example that the plurality of filters 205–208 is a bank of eight filters, each of which support a sampling rate of at least 44.1 kHz. Also presume that the input signal 209 has a sample frequency, Fs, of 11.025 kHz, as may be the case in an audio application. The upsampler 202 upsamples by inserting three zeroes between every sample of the incoming signal 209, thereby giving the upsampled signal 210 an upsampled digitized signal sampling frequency, Fs', of 44.1 kHz. (M equals 4.) Presume that the input signal 209 has frequency components in the entire bandwidth, represented normally as extending from $-\pi$ to $\pi$.

The up sampler 202 begins the process by receiving the incoming signal 209 and inserting zeroes between each of the samples. Where the incoming signal 209 has samples represented x[k], the upsampler output signal 210 may be represented:

Z[k]=x[k] where k=4*n and n is an integer, and
=0 otherwise.

The upsampled signal 210 has a bandwidth of interest that has now been compressed by M, which in this case is a factor of 4. As such, the bandwidth is now $-\pi/4$ to $\pi/4$. The upsampled signal 210 also includes aliased duplicate images that fall within the $-\pi$ to $-\pi/4$ and $\pi/4$ to $\pi$ bandwidths. With prior art systems, a "brick wall" low-pass filter, with a pass band of $\pi/4$ would be needed to remove the duplicates. However, as the predetermined characteristic is known, specifically a maximum frequency of interest at $\pi/4$, the controller 216 is able to deactivate or otherwise set to zero certain band-pass filters, thereby eliminating the duplicates.

As there are eight band-pass filters (represented in FIG. 2 by filters 205–208) being employed, they have the following pass band frequencies: $-\pi/8$ to $\pi/8$ $\pi/8$ to $\pi/4$ to $3\pi/8$; $3\pi/8$ to $\pi/2$; $\pi/2$ to $5\pi/8$, $5\pi/8$ to $3\pi/4$ to $7\pi/8$; and $7\pi/8$ to $\pi$. Since the predetermined characteristic, or maximum frequency of interest is $\pi/4$, all filters having pass bands over $\pi/4$ will be deactivate or set to zero by the controller 216 in accordance with the invention. In other words, the filters having the following pass bands will be set to zero or deactivated: $\pi/4$ to $\pi/8$; $3\pi/8$ to $\pi/2$; $\pi/2$ to $5\pi/8$, $5\pi/8$ to $3\pi/4$ to $7\pi/8$; and $7\pi/8$ to $\pi$. As noted above, the outputs of these filters may be set to zero, or in the alternative, as they may be mathematical filters applied by a processor, they need not even be run or applied to the upsampled signal 210.

The lack of a low-pass filter increases efficiency by not only reducing the number of multiply and accumulate procedures, but by also reducing the number of operations accessing memory. For the preceding example, if a conventional low-pass filter would have had 40 taps, it would have required 40 multiply and accumulate commands in addition to 80 memory access operations to retrieve the samples and filter tap coefficients. Neglecting memory access operations, the invention saves at least 40*44100 multiply and accumulate procedures, which results in a savings of over a million instructions per second.

Note that if it is not possible to cause the outputs 212–215 to be forced to zero, the controller 216 may be coupled to a decoder or synthesis filter bank. The appropriate filters may be zeroed out at that point, thereby accomplishing the same effect.

Any audio component that utilizes an analysis filter bank, like a plurality of band-pass filters, to separate a signal into sub-bands, may only support a limited number of sampling frequencies. As such, the band-pass bandwidths may not correlate exactly to the maximum frequency of interest as in the preceding example. In such cases, most audio applications will accommodate a zeroing of the band-pass filter with a lower cut-off frequency just below the maximum frequency of interest. For example, if the maximum frequency of interest was 4 kHz, and the band-pass filters had band-pass frequencies of 0–3 kHz, 3–6 kHz, 6–9 kHz, the filters including and beyond the 3–6 kHz filter could be zeroed without significantly affecting audio performance.

Figure 3:
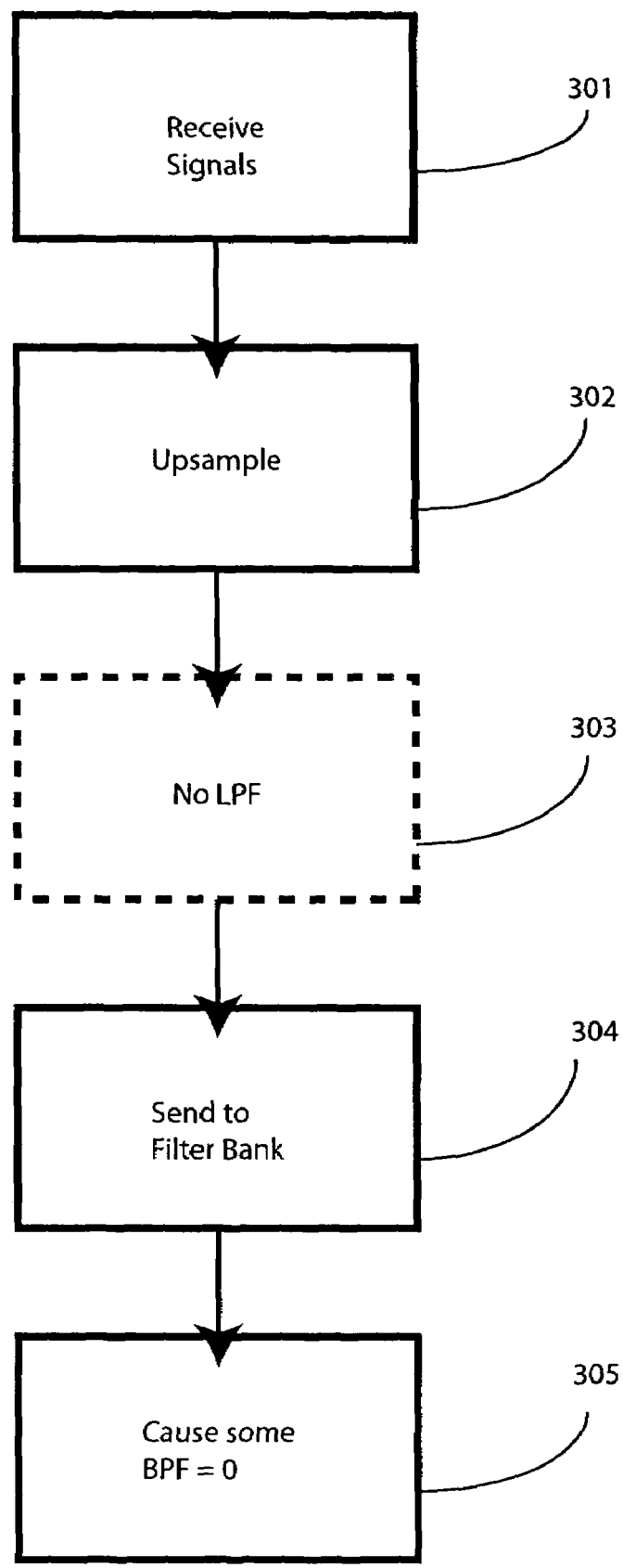
FIG. 3 illustrates a method of efficiently upsampling and filtering in accordance with the invention.

Turning now to FIG. 3, illustrated therein is a method for processing a sampled signal in accordance with the invention. At step 301, a sampled signal having a specific characteristic is received. At step 302, the sampled signal is upsampled. As the sampled signal comprises a plurality of samples, the step of upsampling comprises inserting at least one additional sample between each of the plurality of samples. For example the step of upsampling may include upsampling by a factor of M, where M−1 additional samples are inserted between each of the plurality of samples. As noted above, in one embodiment, the at least one additional sample is a zero.

At step 303, shown in dashed line because it is a step of omission, no low pass filter is applied to the upsampled signal. At step 304, the upsampled, sampled signal is then delivered to a plurality of band-pass filters, as would be used to segregate the signal in an audio encoder application.

At step 305, an output of at least one band-pass filter is adjusted based upon a specific characteristic of the upsampled, sampled signal. In one embodiment, the specific characteristic may be a frequency range of less than a predetermined sampling frequency. The step of adjusting an output may include either causing the output of at least one band-pass filter to be zero or deactivating at least one of the band-pass filters.

Figure 4:
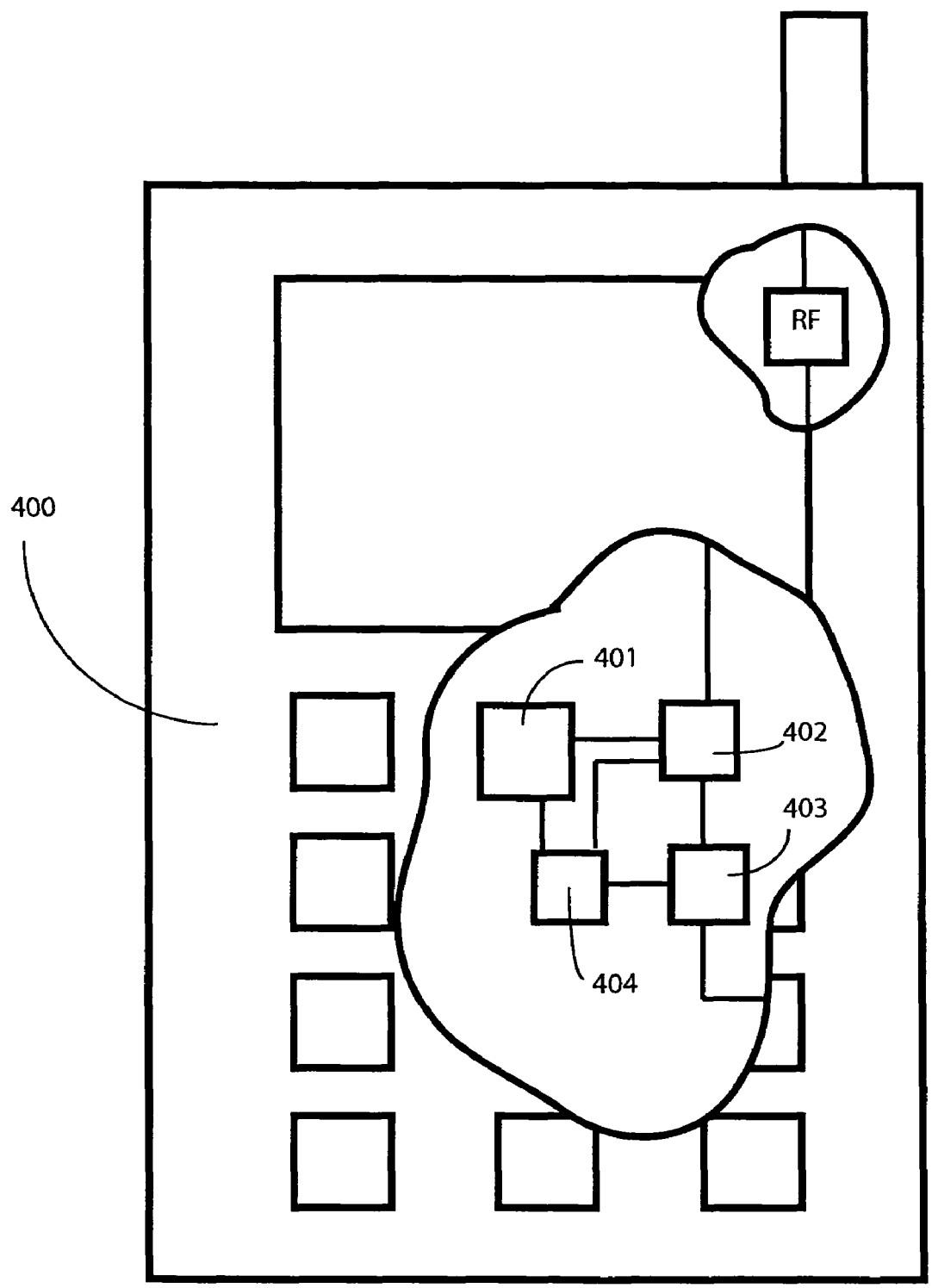
FIG. 4 illustrates an electronic device having an upsampling and filtering system in accordance with the invention.

Turning now to FIG. 4, illustrated therein is one application for an efficient upsampling system and method in accordance with the invention. The illustrative embodiment of FIG. 4 is that of an electronic device 400. The electronic device 400 includes a microprocessor 401 that serves as the central brain of the device 400. The electronic device 400 may be a radiotelephone, audio player, video player or other device.

The device 400 also includes an upsampling module 402 capable of converting a discrete data stream having a first sampling frequency associated therewith, perhaps received and sampled from radio frequency circuitry coupled to the microprocessor 401 for receiving and transmitting electromagnetic signals, into a discrete data stream having a second sampling frequency associated therewith. The upsampling module 402 converts the data stream from the first sampled frequency to the second sampled frequency, in one embodiment, by inserting zeroes between values in the discrete data stream. As noted above, the upsampling module 402 may be integrated into the microprocessor 401. Alternatively, the upsampling module 402 may be effected in a separate component like a digital signal processor or the front end of an audio encoder.

A plurality of band-pass filters 403 are coupled to the upsampling module 402. Each of the plurality of band-pass filters 403 has a unique pass band frequency associated therewith. A control module 404 is coupled to the plurality of band-pass filters. The control module 404 is capable of forcing the outputs of any of the band-pass filters 403 to zero, either by deactivating them or by causing them to yield a zero output.

The control module 404 executes an operation that either adjusts at least one band-pass filter output to zero based upon a predetermined criterion or deactivates at least one band-pass filter based upon a predetermined criterion. The predetermined criterion, for example, may be a maximum frequency of interest. In accordance with the invention, this action of the control module 404 allows the upsampling module to deliver its output to the plurality of band-pass filters 403 without the application of a low-pass filter, thereby saving memory and processing power.

In the foregoing specification, specific embodiments of the present invention have been described. However, one of ordinary skill in the art appreciates that various modifications and changes can be made without departing from the scope of the present invention as set forth in the claims below. Thus, while preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims.

What is claimed is:

1. A system for processing a digitized signal, comprising:
   a. a controller;
   b. an upsampler capable of upsampling the digitized signal, wherein the digitized signal is characterized by a predetermined characteristic,
   wherein the predetermined characteristic comprises a maximum frequency of interest; and
   c. a plurality of filters coupled to the upsampler, wherein the controller adjusts at least one filter output selected from the plurality of filters based upon the predetermined characteristic by executing an operation selected from the group consisting of deactivating the at least one filter and setting an output of the at least one filter to zero.

2. The system of claim 1, wherein the system has no low-pass filter coupled between the plurality of filters and the upsampler.

3. The system of claim 1, wherein the digitized signal comprises a series of samples, wherein the upsampler upsamples the digitized signal by inserting at least one zero between each of the series of samples.

4. The system of claim 1, wherein the digitized signal is upsampled by a factor of M, wherein M is an integer.

5. The system of claim 4, wherein the digitized signal has an upsampled digitized signal sampling frequency, further wherein the plurality of filters comprises N filters, wherein each of the plurality of filters comprises a band-pass filter, wherein the each of the plurality of filters has a pass bandwidth associated therewith of the upsampled digitized signal sampling frequency divided by 2*N.

6. The system of claim 5, further wherein the controller adjusts outputs of each of the plurality of filters having pass band frequencies greater than the upsampled digitized signal sampling frequency divided by M.

7. The system of claim 1, wherein the plurality of filters are effected in a front end module of a signal encoder.

8. A method of processing a sampled signal, the method comprising the steps of:
   a. receiving a sampled signal having a specific characteristic;
   b. upsampling the sampled signal;
   c. delivering an upsampled, sampled signal to a plurality of band-pass filters; and
   d. adjusting an output of at least one band-pass filter selected from the plurality of band-pass filters based upon the specific characteristic of the sampled signal, wherein the step of adjusting an output of at least one band-pass filter comprises an operation selected from the group consisting of causing the output of at least one band-pass filter to be zero and deactivating at least one band-pass filter.

9. The method of claim 8, further comprising the step of omitting an application of a low-pass filter between the step of upsampling and the step of delivering.

10. The method of claim 8, wherein the sampled signal comprises a plurality of samples, wherein the step of upsampling comprises inserting at least one additional sample between each of the plurality of samples.

11. The method of claim 8, wherein the at least one additional sample has a zero value.

12. The method of claim 8, wherein the step of upsampling comprises upsampling by a factor of M by inserting M−1 additional samples between each of the plurality of samples.

13. The method of claim 8, wherein the specific characteristic comprises a frequency range of less than a predetermined sampling frequency.

14. A portable electronic device, comprising:
   a. a microprocessor;
   b. radio frequency circuitry coupled to the microprocessor for receiving and transmitting electromagnetic signals;
   c. a signal processing module comprising:
      i. a control module;
      ii. an upsampling module capable of converting a discrete data stream having a first sampling frequency associated therewith into a discrete data stream having a second sampling frequency associated therewith;

iii. a plurality of band-pass filters coupled to the upsampling module, each of the plurality of band-pass filters having a unique pass band frequency associated therewith;

wherein the control module executes an operation selected from adjusting at least one band-pass filter output of the plurality of band-pass filters to zero based upon a predetermined criterion and deactivating at least one band-pass filter based upon a predetermined criterion.

15. The portable electronic device of claim 14, wherein the upsampling module converts the discrete data stream having a first sampling frequency associated therewith into the discrete data stream having a second sampling frequency associated therewith by inserting zeroes between values in the discrete data stream having a first sampling frequency associated therewith.

16. The portable electronic device of claim 15, wherein the portable electronic device comprises a radiotelephone, further wherein the predetermined criterion comprises a maximum frequency of interest.

17. The radiotelephone of claim 14, wherein the upsampling module delivers an output to the plurality of band-pass filters without an application of a low-pass filter.

* * * * *